United States Patent
Bell et al.

(10) Patent No.: US 10,132,876 B2
(45) Date of Patent: Nov. 20, 2018

(54) TESTER FOR WIRELESS ELECTRIFIED VEHICLE CHARGER

(71) Applicant: FORD GLOBAL TECHNOLOGIES, LLC, Dearborn, MI (US)

(72) Inventors: Christopher W. Bell, Livonia, MI (US); John Paul Gibeau, Canton, MI (US); James A. Lathrop, Saline, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 437 days.

(21) Appl. No.: 14/675,841

(22) Filed: Apr. 1, 2015

(65) Prior Publication Data

US 2016/0291095 A1    Oct. 6, 2016

(51) Int. Cl.
*G01R 31/40* (2014.01)
*H02J 7/02* (2016.01)
*G01R 31/42* (2006.01)
*B60L 11/18* (2006.01)
*H02J 50/10* (2016.01)
*H02J 50/80* (2016.01)
*G01R 31/00* (2006.01)

(52) U.S. Cl.
CPC .......... *G01R 31/42* (2013.01); *B60L 11/182* (2013.01); *B60L 11/1829* (2013.01); *B60L 11/1833* (2013.01); *G01R 31/006* (2013.01); *H02J 50/10* (2016.02); *H02J 50/80* (2016.02); *Y02T 10/7005* (2013.01); *Y02T 10/7072* (2013.01); *Y02T 90/12* (2013.01); *Y02T 90/121* (2013.01); *Y02T 90/122* (2013.01); *Y02T 90/125* (2013.01); *Y02T 90/14* (2013.01)

(58) Field of Classification Search
CPC ....... G01R 31/006; G01R 31/40; H02J 7/027; H02J 7/025; H02J 7/0004; H02J 7/0052; H02J 50/10; H02J 50/80; B60L 3/003; B60L 3/0046; B60L 3/0069
See application file for complete search history.

(56) References Cited

U.S. PATENT DOCUMENTS

| 8,120,311 B2 | 2/2012 | Baarman et al. |
| 8,796,990 B2 | 8/2014 | Paparo et al. |

(Continued)

FOREIGN PATENT DOCUMENTS

KR    1020130049845    5/2013

OTHER PUBLICATIONS

Demorro, Christopher, WiRriCity Wireless Charging Gains Momentum, Sep. 3, 2014, retrieved from http://evobsession.com/witricity-wireless-charging-gains-momentum/.

*Primary Examiner* — Minh N Tang
(74) *Attorney, Agent, or Firm* — Carlson, Gaskey & Olds, P.C.

(57) ABSTRACT

An exemplary assembly for testing a wireless charge transmit system includes a portable tester that is configured to mimic a vehicle mounted charge receive system and to wirelessly interface with a wireless charge transmit system. An exemplary method of testing a wireless charge transmit station for an electrified vehicle includes positioning a portable tester relative to the wireless charge transmit station, and using the portable tester to mimic an electrified vehicle interfacing with the wireless charge transmit station.

20 Claims, 3 Drawing Sheets

(56) References Cited

U.S. PATENT DOCUMENTS

| | | | |
|---|---|---|---|
| 9,637,014 B2 * | 5/2017 | Schneider | H02J 50/12 |
| 2012/0161925 A1 | 6/2012 | Gale et al. | |
| 2012/0206098 A1 * | 8/2012 | Kim | B60L 11/182 |
| | | | 320/108 |
| 2012/0265475 A1 * | 10/2012 | Gray | G01R 31/40 |
| | | | 702/117 |
| 2013/0346010 A1 | 12/2013 | Schulz | |
| 2014/0217966 A1 * | 8/2014 | Schneider | B60L 11/182 |
| | | | 320/108 |

\* cited by examiner ically recharged. During a wireless recharge, a vehicle mounted charge receive system interfaces with a wireless charge transmit system to recharge the battery.

TESTER FOR WIRELESS ELECTRIFIED VEHICLE CHARGER

TECHNICAL FIELD

This disclosure relates generally to testing a wireless charge transmit system for an electrified vehicle. The wireless charge transmit system is tested with a portable charger, and without requiring an electrified vehicle.

BACKGROUND

Generally, electrified vehicles differ from conventional motor vehicles because electrified vehicles are selectively driven using one or more battery-powered electric machines. Conventional motor vehicles, in contrast to electrified vehicles, are driven exclusively using an internal combustion engine. The electric machines can drive the electrified vehicles instead of, or in addition to, an internal combustion engine. Example electrified vehicles include all-electric vehicles, hybrid electric vehicles (HEVs), plug-in hybrid electric vehicles (PHEVs), fuel cell vehicles, and battery electric vehicles (BEVs).

The batteries of some electrified vehicles can be wirelessly recharged. During a wireless recharge, a vehicle mounted charge receive system interfaces with a wireless charge transmit system to recharge the battery.

SUMMARY

An assembly for testing a wireless charge transmit system, according to an exemplary aspect of the present disclosure, includes, among other things, a portable tester that is configured to mimic a vehicle mounted charge receive system and to wirelessly interface with a wireless charge transmit system.

In a further non-limiting embodiment of the foregoing assembly, the portable tester is not mounted to a vehicle.

In a further non-limiting embodiment of any of the foregoing assemblies, the portable tester includes a receiver coil to receive transmitted power from the wireless charge transmit system.

In a further non-limiting embodiment of any of the foregoing assemblies, the portable tester includes a load bank to dissipate power received from the wireless charge transmit system.

In a further non-limiting embodiment of any of the foregoing assemblies, the portable tester includes a radio frequency communication module to wirelessly communicate with the wireless charge transmit system.

In a further non-limiting embodiment of any of the foregoing assemblies, the radio frequency communication module is configured to wirelessly communicate with the wireless charge transmit system via Wi-Fi.

In a further non-limiting embodiment of any of the foregoing assemblies, the assembly includes a vertical adjustment device to selectively adjust a vertical position of a receiver coil of the portable tester relative to the wireless charge transmit system.

In a further non-limiting embodiment of any of the foregoing assemblies, the assembly includes a horizontal adjustment device to selectively adjust a horizontal position of a receiver coil of the portable tester relative to the wireless charger transmit system.

In a further non-limiting embodiment of any of the foregoing assemblies, the portable tester includes at least a receiver coil to receive transmitted power from the wireless charge transmit system, a load bank to dissipate power received from the wireless charge transmit system, a radio frequency communication module to wirelessly communicate with the wireless charge transmit system, and an adjustment device to selectively position at least the receiver coil relative to a transmit coil of the wireless charge transmit system.

A method of testing a wireless charge transmit station for an electrified vehicle, according to another exemplary aspect of the present disclosure, includes, among other things, positioning a portable tester relative to the wireless charge transmit station, and using the portable tester to mimic an electrified vehicle interfacing with the wireless charge transmit station.

In a further non-limiting embodiment of the foregoing method, the portable tester is detached from an electrified vehicle.

In a further non-limiting embodiment of any of the foregoing methods, the method includes transmitting power to a receiver coil of the portable tester from the wireless charge transmit station during the using.

In a further non-limiting embodiment of any of the foregoing methods, the method includes dissipating power received from the wireless charge transmit station into a load bank of the portable tester during the using.

In a further non-limiting embodiment of any of the foregoing methods, the method includes wirelessly communicating with the wireless charge transmit station using the portable tester.

In a further non-limiting embodiment of any of the foregoing methods, the wireless communicating includes wirelessly communicating using Wi-Fi.

In a further non-limiting embodiment of any of the foregoing methods, the method includes actuating a vertical adjustment device of the portable tester to vertically position a receiver coil of the portable tester relative to the wireless charge transmit station during the positioning.

In a further non-limiting embodiment of any of the foregoing methods, the method includes actuating a horizontal adjustment device of the portable tester to horizontally position a receiver coil of the portable tester relative to the wireless charge transmit station during the positioning.

In a further non-limiting embodiment of any of the foregoing methods, the using of the portable tester includes receiving power transmitted from the wireless charge transmit system, dissipating power received from the wireless charge transmit system, wirelessly communicating with the wireless charge transmit system, and manipulating an adjustment device to position at least a receiver coil of the portable tester relative to a transmit coil of the wireless charge transmit system.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

Figure 1:
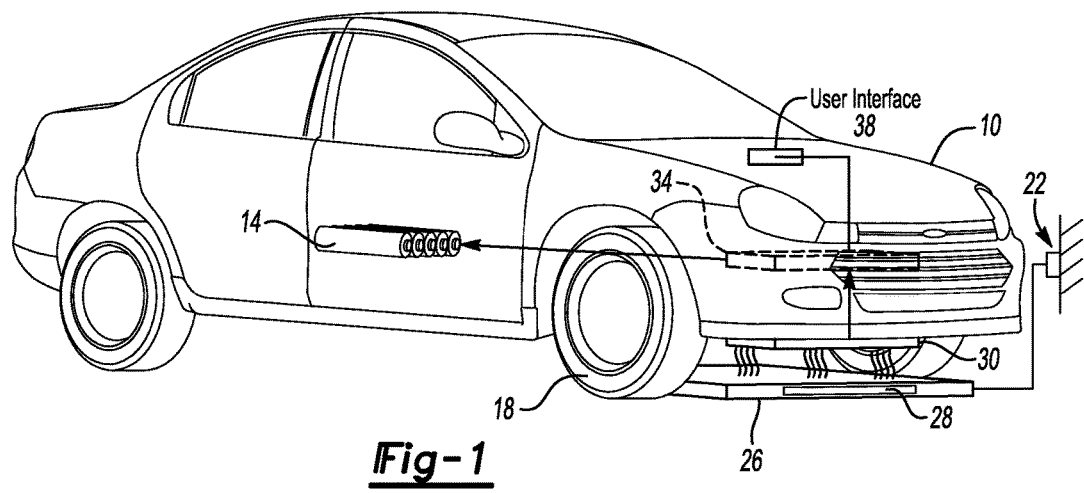
FIG. 1 shows a perspective, and partially schematic, view of an electrified vehicle during a wireless charging procedure.

Referring to FIG. 1, an electrified vehicle 10 includes a battery 14. Power from the battery 14 is used to power electric machines that rotate drive wheels 18 of the vehicle 10.

The example vehicle 10 is an all-electric vehicle. The vehicle 10 could be another type of electrified vehicle in other examples, such as a hybrid electric vehicle.

The vehicle 10 is depicted in a position appropriate for a wireless charging procedure. In this position, power from a wall source 22 can be communicated to the battery 14 to charge the battery 14.

In this example, the battery 14 of the vehicle 10 is wirelessly charged. During the wireless charge procedure, power, from the wall source 22, moves to a wireless charge transmit system 26. The power from the wall source 22 moves to the wireless charge transmit system 26 via a wired connection in this example.

A vehicle mounted charge receive system 30 then receives power, wirelessly. The power is transmitted via electromagnetic induction, for example. The power is transmitted from a coil 28 of the wireless charge transmit system 26 to a coil of the vehicle mounted charge receive system. The power is communicated from the vehicle mounted charge receive system to the battery 14.

A controller 34 within the vehicle 10 can be used to control flow of power to the battery 14 during the charging. A user interface 38 can be used to display charging progress. The user interface 38 may be a display screen within the vehicle 10. The user interface 38 could also be a display separate from the vehicle 10, such as a display within a portable device carried by a user of the vehicle 10. The user interface 38 may include features for controlling a rate of the charge, as well as displaying, among other things, a time until the charge will be complete, and a current charge status of the battery 14.

The wireless charge transmit system 26 can be positioned where the vehicle 10 is frequently parked, such as on a garage floor. The vehicle 10 drives over the wireless charge transmit system 26 to position the vehicle mounted charge receive system 30 over the wireless charge transmit system 26.

A person having skill in this art and the benefit of this disclosure would understand how to charge the vehicle 10 using the wireless charge transmit system 26 and the vehicle mounted charge receive system 30.

Figure 2:
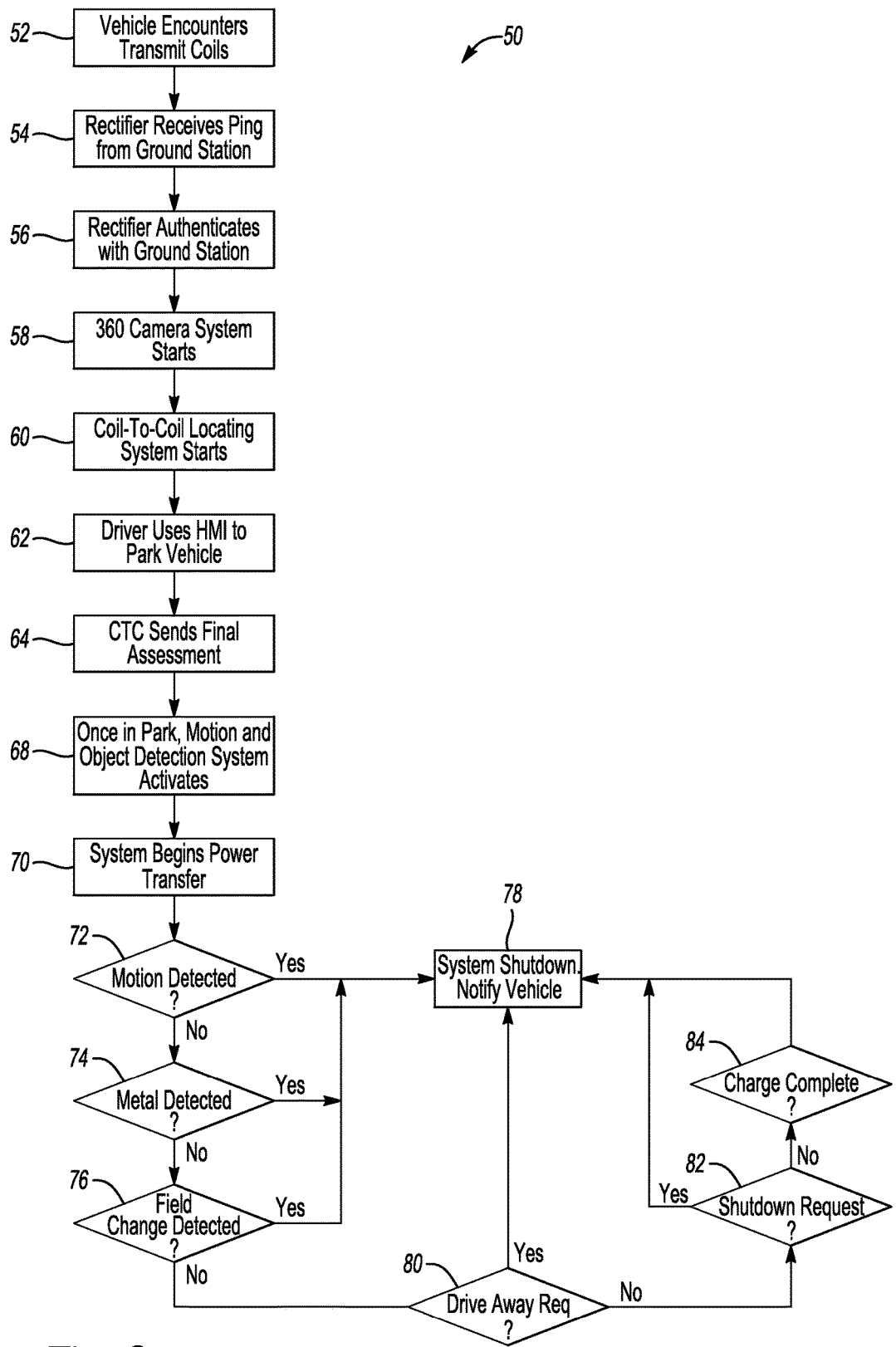
FIG. 2 shows a flow of an example method for a wireless charging a battery of the vehicle of FIG. 1.

Referring now to FIG. 2 with continuing reference to FIG. 1, an example method 50 for wirelessly recharging the vehicle 10 includes moving, at a step 52, the vehicle 10 over the wireless charge transmit system 26. After the step 52, the vehicle mounted charge receive system 30 of the vehicle 10, is positioned in appropriate proximity to a transmit coil of the wireless charge transmit system 26.

The wireless charge transmit system 26 is configured to wirelessly communicate with the vehicle mounted charge receive system 30, such as by Wi-Fi radio communications. The wireless charge transmit system 26 continually sends wireless pings.

As the vehicle 10 moves closer to the wireless charge transmit system 26, a rectifier within the vehicle mounted charge receive system 30 receives a ping from wireless charge transmit system 26. The ping is received at a step 54. The rectifier within the vehicle mounted charge receive system 30 then authenticates with the wireless charge transmit system 26 at a step 56.

At a step 58, a camera, such as a 360° camera, begins to operate. The example camera is mounted to the vehicle 10. The camera provides feedback to the controller 34 that is then displayed on the user interface 38. The feedback from the camera helps an operator of the vehicle 10 to begin to position the vehicle 10 over the wireless charge transmit system 26.

At a step 60, a locating system within the controller 34 begins. The locating system is used to position a coil of the vehicle mounted charge receive system 30 in an appropriate position relative to a coil of the wireless charge transmit system 26.

A driver of the vehicle 10 may, at a step 62, additionally use a human machine interface ("HMI") to assist a driver to park the vehicle 10 in a position appropriate for wireless charging.

At a step 64, the controller 34 assesses whether the vehicle mounted charge receive system 30 is positioned appropriately for charging the vehicle over the wireless charge transmit system 26.

At a step 68, a motion and object detection system within the vehicle 10 is activated. Wireless charging then begins at a step 70.

The motion and object detection system can terminate the wireless charging. Specifically, at a step 72, if motion is detected, the charging is terminated at a step 74. The motion could be an object moving between the wireless charge transmit system 26 and the vehicle mounted charge receive system 30. For example, a basketball could roll beneath the vehicle 10 and be detected at the step 72.

At a step 74, the method 50 shuts down the charging if the object detection system of the vehicle 10 detects metal. As can be appreciated, metal positioned beneath or in proximity to the wireless charge transmit system 26, the vehicle mounted charge receive system 30, or both, can disrupt charging. The step 74 ensures that charging stops if such metal is detected.

At a step 76, the detection system within the vehicle 10 terminates the charging and moves to the step 74 if a fuel change in the wireless charging field is detected. The field change may be caused by motion of the vehicle 10 relative to the wireless charge transmit system 26, for example.

At a step 80, the method 50 determines if a drive away for the vehicle 10 has been requested. Opening a door of the vehicle 10, or starting the vehicle 10 could indicated that a drive away has been requested, for example.

If a drive away is requested at the step 80, the method 50 moves to the step 74 where the charging is shut down.

If no drive away is requested, the method moves to a step 82 to determine if any charging shut down request have been provided. A user of the vehicle 10 may choose to stop wirelessly charging the vehicle. The input regarding shutting down the charging may be provided via the user interface 38 or by some other mechanism, such as through a personal device like a smart phone.

At a step 84, the method calculates whether the charging of the battery 14 is complete. If so, charging stops and the method moves to the step 74.

As can be appreciated, the components and steps for wirelessly charging the vehicle 10 can be relatively complex. Many factors could prevent the vehicle 10 from wirelessly recharging. Factors may include a broken component within the wireless charge transmit system 26, the vehicle mounted charge receive system 30, or within some other component connected to the vehicle 10. Troubleshooting errors and defective components within these systems can be difficult, especially when the vehicle 10 is required to assess functionality of the wireless charge transmit system 26.

Figure 3:
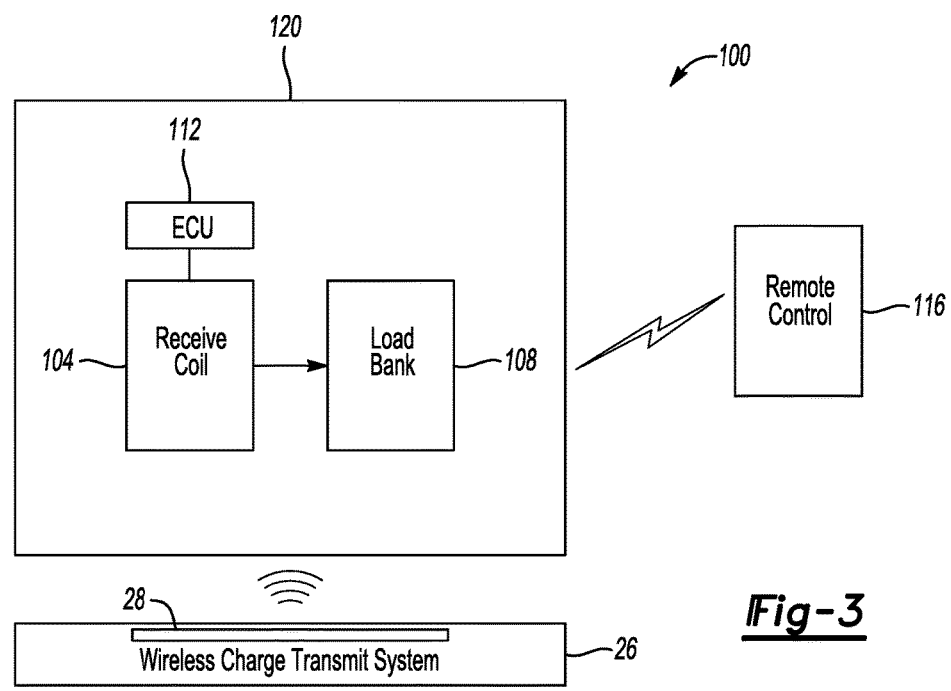
FIG. 3 shows a highly schematic view of an example portable tester useable in connection with a wireless charge transmit system from FIG. 1.
Figure 4:
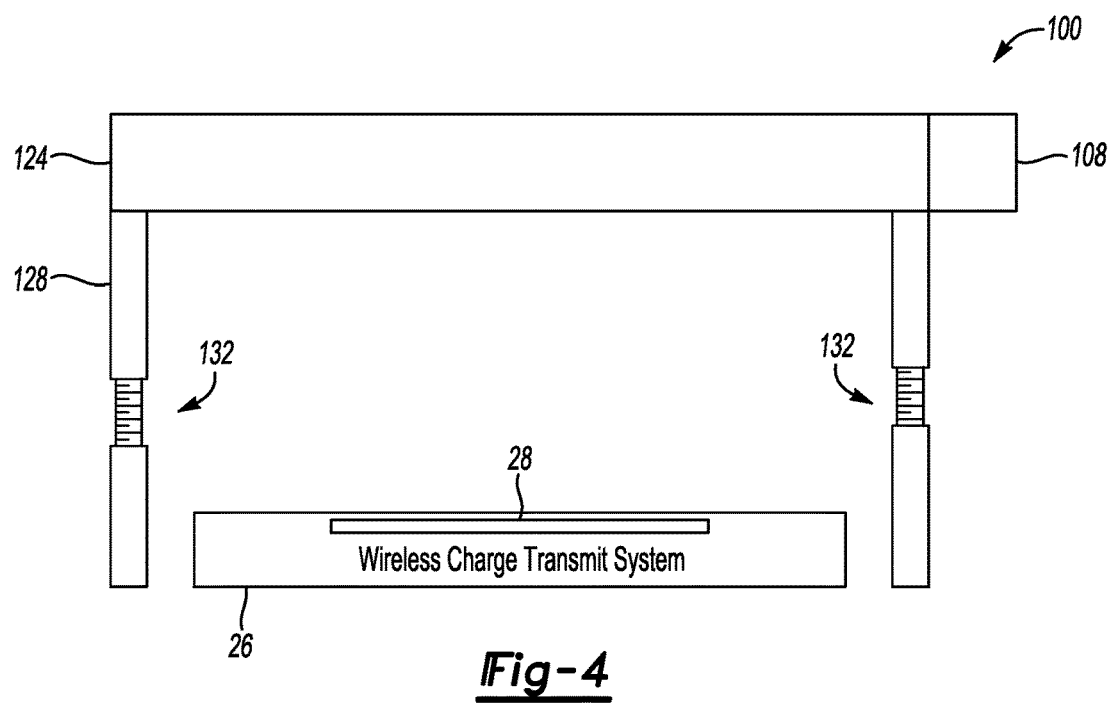
FIG. 4 shows a side view of the portable tester of FIG. 3.
Figure 5:
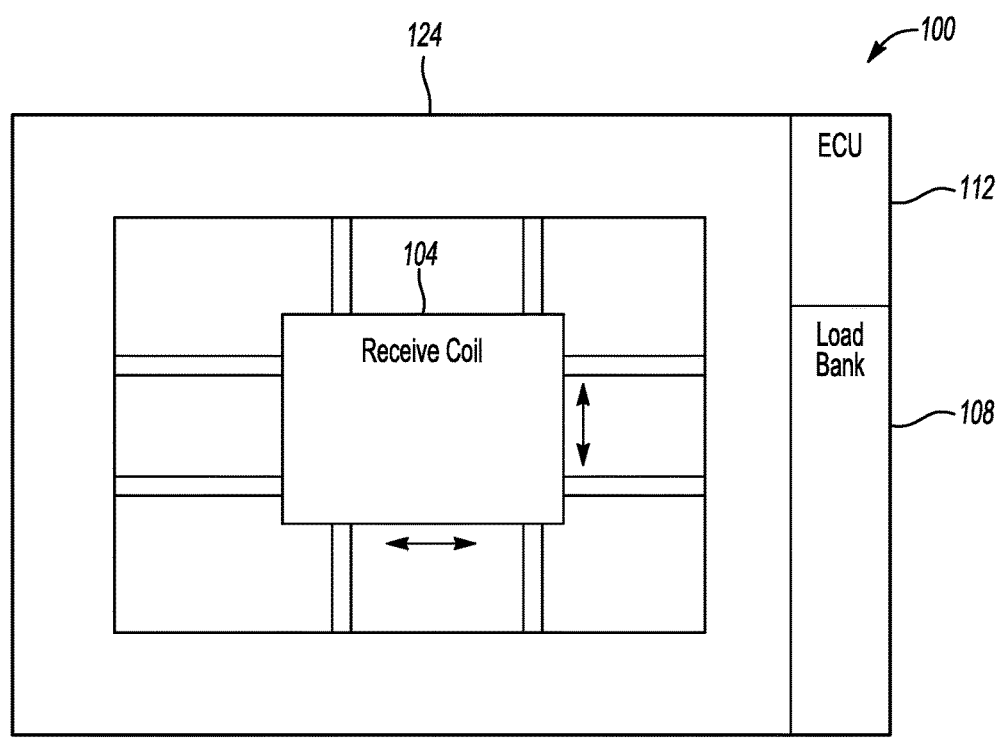
FIG. 5 shows a top view of the portable tester of FIG. 3.

Referring to FIGS. 3 to 5, a portable tester 100 is used to test at least the wireless charge transmit system 26. The portable tester 100 can test the wireless charge transmit system 26 without requiring the vehicle 10. The portable tester 100 is particularly useful for a technician in the field attempting to diagnose issues with charging the vehicle 10.

The portable tester 100 includes, in this example, a receiver coil 104, a load bank 108, a radio frequency communication module 112, a remote control 116, and a housing 120. The portable tester 100 is configured to mimic the performance and interfaces of the vehicle mounted charge receive system 30 without requiring the vehicle 10. In some examples, the portable tester 100 includes components enabling the portable tester 100 to replicate each of the steps in the method 50 performed by the vehicle 10.

The remote control 116 permits a technician to stand away from the portable tester 100 and conduct and control a test procedure. The technician can remotely execute the method (FIG. 2) using the portable tester 100 rather than a vehicle.

Operating the portable tester 100 from a remote location limits the technician's exposure to the electromagnetic field generated during the test.

To test the wireless charge transmit system 26 using the portable tester 100, the portable tester 100 is positioned over the wireless charge transmit system 26 as shown in FIG. 4.

In the example portable tester 100, the housing 120 includes a platform 124 supported by legs 128. Each of the example legs 128 includes a vertical adjustment device 132. Adjustments to the vertical adjustment device 132 cause the legs 128 to shorten or lengthen, which can vertically raise or lower the platform 124 relative to the wireless charge transmit system 26, and specifically the coil 28.

Different types of vehicles may have vehicle mounted charge receive systems at varying vertical heights. The vertical adjustment devices 132 enables a technician to position the platform 24, and specifically the receiver coil 104 within the platform 124, at a desired vertical position relative to the wireless charge transmit system 26 to mimic many vehicles and heights. The desired vertical position may correspond to a vertical position of the vehicle mounted charge receive system 30 within the vehicle 10.

The vertical adjustment devices 132 comprise threaded sections in this example. Rotating the threaded sections in a first direction shortens the legs 128 to lower the platform 124. Rotating the threaded sections in an opposite, second direction lengthens the legs 128 to raise the platform 124. Vertical adjustment devices 132 other than threaded sections could be used in other examples. The vertical adjustment devices 132 can be powered in some examples.

The vertical adjustment devices 132 could include pins received in holes to adjust the height, or some other type of adjustment technique to change the length of the legs 128.

The platform 124 also includes a plurality of horizontal adjustment devices 136 that are used to position the receiver coil 104 within the platform 124 at varying horizontal positions. A technician may adjust the horizontal adjustment devices 136 to reposition the moveable coil 104.

The horizontal adjustment devices 136 are rails extending across a platform opening in this example. The receive coil 104 can slide around on the rails to adjust the horizontal position of the receiver coil 104 relative to the wireless charge transmit system. The horizontal adjustment devices 136 can be powered in some examples.

Testing the wireless charge transmit system 26 can include positioning the portable tester 100 over the wireless charge transmit system 26 and then manipulating the vertical adjustment devices 132 and the horizontal adjustment devices 136 to fine tune the position of the receiver coil 104 relative to the wireless charge transmit system 126. The manipulations could occur in response to a command from the remote control 116. The technician can hold the remote control in some examples.

The radio frequency communication module 112 of the portable tester 100 then receives a ping from the wireless charge transmit system 26. The ping is transmitted to the radio frequency communication module 112 via Wi-Fi in this example, although other forms of radio communications may be used.

The receiver coil 104 of the portable tester 100 then receives power from the wireless charge transmit system 26. This power is communicated directly to a load bank 108, which dissipates the received power. The load bank 108 may include an array of resistors for dissipating power received from the wireless charge transmit system 26.

If the power is ineffectively transferred to the portable tester 120, the technician may use this information to identify a problem with the wireless charge transmit system 26. Notably, this problem or issue is identified without the use of a vehicle 10 and without the requirement to reposition the vehicle 10 relative to the wireless charge transmit system 26.

The technician may identify a problem or issue by executing the method 50 from the FIG. 2 and verifying that each step is executed properly.

Using the vertical adjustment devices 132 and the horizontal adjustment devices 136 enables the technician to manipulate the position of the receiver coil 104 relative to the wireless charge transmit system 26. This may help identify certain positions associated with the wireless charge transmit system 26 resulting in ineffective power transfer. The manipulations of the position of the receiver coil 104 may occur during the power transfer in some examples.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. An assembly for testing a wireless charge transmit system, comprising:
   a portable tester that is configured to mimic a vehicle mounted charge receive system and to wirelessly interface with a wireless charge transmit system, the wireless charge transmit system positioned to charge a battery of a vehicle that is parked above a transmit coil of the wireless charge transmit system.

2. The assembly of claim 1, further comprising the wireless charge transmit system, wherein the wireless charge transmit system is not mounted to the vehicle, wherein the portable tester is not mounted to the vehicle.

3. The assembly of claim 1, wherein the portable tester comprises a receiver coil to receive transmitted power from the wireless charge transmit system.

4. The assembly of claim 1, wherein the portable tester comprises a load bank to dissipate power received from the wireless charge transmit system.

5. The assembly of claim 4, further comprising a vertical adjustment device to selectively adjust together a vertical position of both a load bank and a receiver coil of the portable tester relative to the wireless charge transmit system.

6. The assembly of claim 1, wherein the portable tester comprises a radio frequency communication module to wirelessly communicate with the wireless charge transmit system and to receive commands from a remote control that is remote from the portable tester, the commands from the remote control causing the portable tester to change a position of a receiver coil of the portable tester relative to the transmit coil of the wireless charge transmit system.

7. The assembly of claim 1, further comprising a vertical adjustment device to selectively adjust a vertical position of a receiver coil of the portable tester relative to the wireless charge transmit system.

8. The assembly of claim 1, further comprising a horizontal adjustment device selectively adjust a horizontal position of a receiver coil of the portable tester relative to the wireless charger transmit system.

9. The assembly of claim 1, wherein the portable tester comprises at least:
- a receiver coil to receive transmitted power from the wireless charge transmit system;
- a load bank to dissipate power received from the wireless charge transmit system;
- a radio frequency communication module to wirelessly communicate with the wireless charge transmit system; and
- an adjustment device to selectively position at least the receiver coil relative to a transmit coil of the wireless charge transmit system.

10. The assembly of claim 9, further comprising a vertical adjustment device of the adjustment device, the vertical adjustment device configured to selectively adjust together a vertical position of the load bank, the receiver coil, and the radio frequency communication module relative to the wireless charge transmit station, the load bank including an array of resistors.

11. A method of testing a wireless charge transmit station for an electrified vehicle, comprising:
- positioning a portable tester relative to the wireless charge transmit station, the wireless charge transmit station located such that the wireless charge transmit station is positioned to charge an electrified vehicle parked above a transmit coil of the wireless charge transmit station; and
- using the portable tester to mimic the electrified vehicle interfacing with the wireless charge transmit station.

12. The method of claim 11, wherein the portable tester is detached from the electrified vehicle.

13. The method of claim 11, further comprising dissipating power received from the wireless charge transmit station into a load bank of the portable tester during the using.

14. The method of claim 13, further comprising actuating a vertical adjustment device of the portable tester to vertically position both the load bank and a receiver coil of the portable tester relative to the wireless charge transmit station during the positioning.

15. The method of claim 11, further comprising wirelessly communicating with the wireless charge transmit station using the portable tester, wireless communicating with the wireless charge transmit station using a remote control that is remote from the portable tester, and changing a position of a receiver coil of the portable tester relative to the wireless charge transmit station in response to wireless communications initiated from the remote control.

16. The method of claim 11, further comprising actuating a vertical adjustment device of the portable tester to vertically position a receiver coil of the portable tester relative to the wireless charge transmit station during the positioning.

17. The method of claim 11, further comprising actuating a horizontal adjustment device of the portable tester to horizontally position a receiver coil of the portable tester relative to the wireless charge transmit station during the positioning.

18. The method of claim 11, wherein the using of the portable tester comprises at least:
- receiving power transmitted from the wireless charge transmit station;
- dissipating power received from the wireless charge transmit station;
- wirelessly communicating commands to the wireless charge transmit station from a location that is remote from the portable tester and the wireless charge transmit system; and
- manipulating an adjustment device to position at least a receiver coil of the portable tester relative to a transmit coil of the wireless charge transmit system in response to the commands.

19. The method of claim 11, further comprising operating the portable tester using a remote control during a test procedure, such that the test procedure can be controlled from a location that is remote from the portable tester.

20. A method of testing a wireless charge transmit station for an electrified vehicle, comprising:
- positioning a portable tester relative to the wireless charge transmit station, the wireless charge transmit station located in a position where the wireless charge transmit station is positioned to charge an electrified vehicle parked above a transmit coil of the wireless charge transmit station; and
- using the portable tester to mimic the electrified vehicle interfacing with the wireless charge transmit station; and
- without moving the wireless charge transmit station, repositioning the portable tester away from the wireless charge transmit station and positioning the electrified vehicle over the wireless charge transmit station so that the transmit coil is positioned to transmit power to the electrified vehicle.

* * * * *